United States Patent [19]

Maruyama

[11] Patent Number: 5,281,969
[45] Date of Patent: Jan. 25, 1994

[54] NOISE SHAPER CIRCUIT

[75] Inventor: Yuichi Maruyama, Kanagawa, Japan
[73] Assignee: NEC Corporation, Tokyo, Japan
[21] Appl. No.: 874,584
[22] Filed: Apr. 24, 1992

[30] Foreign Application Priority Data

Apr. 30, 1991 [JP] Japan .................................. 3-128759

[51] Int. Cl.⁵ ................................................ H03M 3/02
[52] U.S. Cl. ...................................... 341/143; 341/77
[58] Field of Search ............................. 341/76, 77, 143

[56] References Cited

U.S. PATENT DOCUMENTS

| | | | |
|---|---|---|---|
| 5,057,840 | 10/1991 | Ledzius et al. ...................... | 341/144 |
| 5,079,551 | 1/1992 | Kimura et al. ...................... | 341/143 |
| 5,155,743 | 10/1992 | Jacobs ................................. | 375/28 |
| 5,181,032 | 1/1993 | Ribner ................................ | 341/143 |

FOREIGN PATENT DOCUMENTS

WO91/04611  4/1991  PCT Int'l Appl. .

OTHER PUBLICATIONS

Peter J. A. Naus et al. "A CMOS Stereo 16-bit D/A Converter for Digital Audio" IEEE Journal of Solid-State Circuits, vol. sc-22, No. 3, Jun. 1987 pp. 390-394.

Primary Examiner—Marc S. Hoff
Attorney, Agent, or Firm—Whitham & Marhoefer

[57] ABSTRACT

According to this invention, a noise shaper circuit capable of realizing an integrated circuit having a small chip area is provided.

In calculating circuits for calculating input data represented by a twos complement and feedback data of output data converted into data having a small word length, the input data is divided into upper bits and lower bits with respect to a bit rounded off during a word length converting operation, only the upper bits are used in a calculation, and the calculation result and the lower bits which are not used in the calculation are added to the LSB of the calculation result again, and the resultant data is output to the next stage.

15 Claims, 2 Drawing Sheets

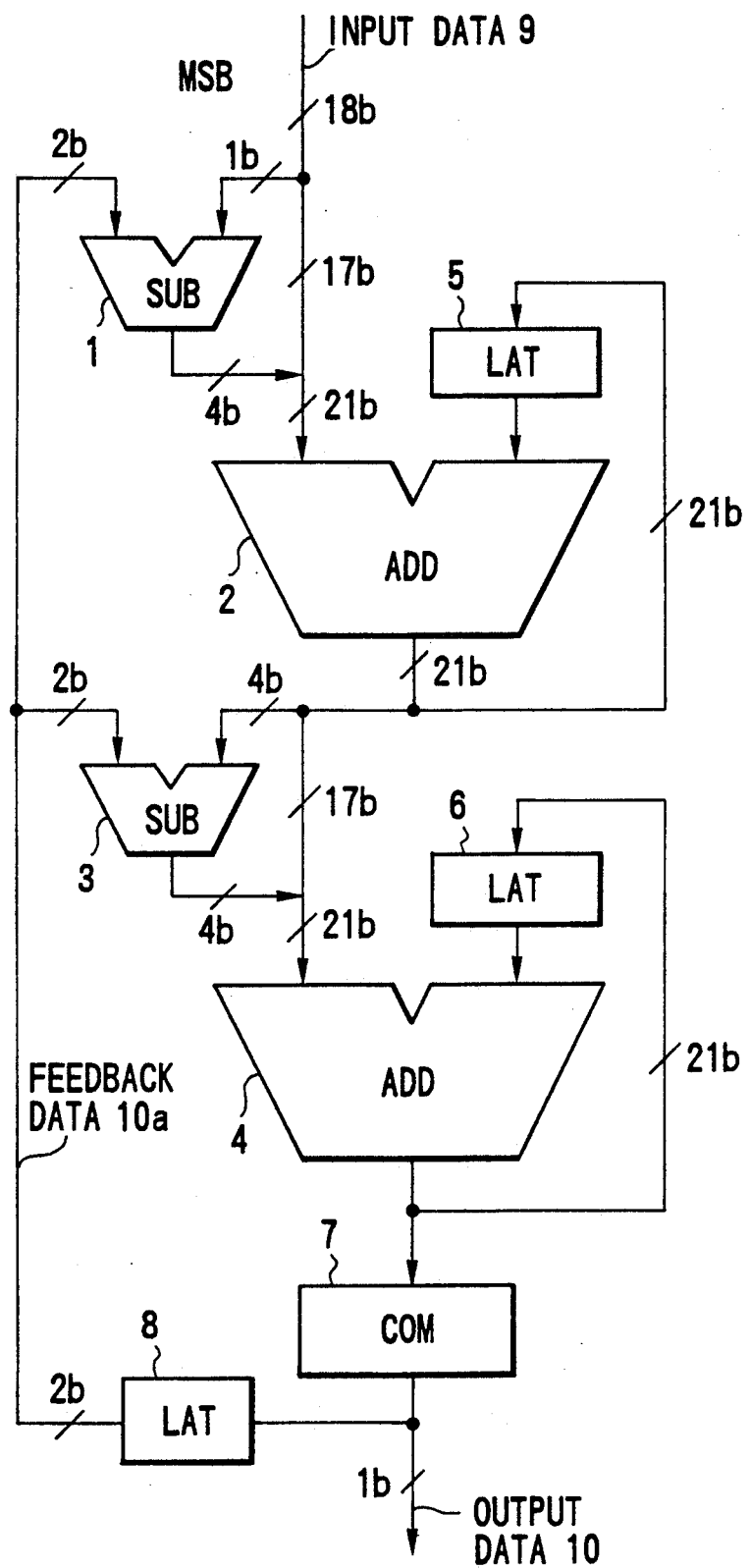
F I G. 1

NOISE SHAPER CIRCUIT

BACKGROUND OF THE INVENTION

The present invention relates to a noise shaper circuit used in a digital/analog converter of an over-sampling method and, more particularly, to a noise shaper circuit, using a $\Delta$ modulation method or a $\Delta\Sigma$ modulation method, for rounding data having an arbitrary number of bits into data having a smaller number of bits.

As a conventional noise shaper circuit used in a digital/analog converter of an over-sampling method, a circuit having characteristics represented by a signal flow graph of a secondary $\Delta\Sigma$ modulator shown in FIG. 2 is generally used. However, when this flow graph is directly realized as a circuit, four calculating circuits 11 to 14 each having a large word length are required, i.e., the circuits 11 to 14 requires a large chip area when the circuits are integrated.

Therefore, as shown in FIG. 3, a circuit in which the number of calculating circuits is decreased to reduce a chip area and a signal flow graph is modified is proposed ("IEEE JOURNAL OF SOLID-STATE CIRCUITS" VOL. SC-22, NO. 3, PP. 390-394, June, 1987). The transfer characteristics of this circuit are the same as those of the circuit in FIG. 2. This circuit of FIG. 3 has three calculating circuits 21, 22, and 23, and the number of calculating circuits is smaller than that of the circuit in FIG. 2. However, when the signal flow graph in FIG. 3 is to be realized in an integrated circuit, the following problem is posed. That is, in processing of data having a large word length, since the wiring lines of the circuit in FIG. 3 are more complicated than those of the circuit in FIG. 2, the data having a large word length requires a large area for data lines. Therefore, the chip area of the integrated circuit is not so reduced.

In FIGS. 2 and 3, reference numerals 15, 16, 18, 24, and 25 denote delay circuits; 17, 28, and 29, quantizers; and 26 and 27, amplitude limiters.

As described above, when a conventional noise shaper circuit is to be realized in an integrated circuit, a chip area is disadvantageously large.

SUMMARY OF THE INVENTION

It is an object of the present invention to provide a noise shaper circuit capable of realizing a integrated circuit having a small chip area even when data having a large word length is processed.

In order to achieve the above object, according to the present invention, there is provided a noise shaper circuit comprising: first and third calculating means for dividing input data having an arbitrary number of bits into upper bits and lower bits with respect to a bit rounded off during a word length converting operation, calculating a difference between the upper bits and feedback data fed back from output data, and linking the difference and the lower bits of the input data to output linked data, second and fourth calculating means for adding the linked data output from the first and third calculating means to output data fed back from addition outputs from the second and fourth calculating means, respectively, and means for rounding the output data from the fourth calculating means into output data having a smaller number of bits, wherein the output data from the second calculating means is supplied to the third calculating means, and the output data from the rounding means is supplied to the first and third calculating means as the feedback data.

BRIEF DESCRIPTION OF THE DRAWINGS

FIG. 1 is a block diagram showing an embodiment of the present invention;

DESCRIPTION OF THE PREFERRED EMBODIMENT

An embodiment of the present invention will be described below with reference to the accompanying drawings.

FIG. 1 is a block diagram showing an embodiment of the present invention and shows a circuit for rounding 18-bit input data represented by a twos complement into 1-bit output data. The circuit depends on a signal flow graph shown in FIG. 2. Numbers on signal lines in FIG. 1 denote the numbers of bits.

According to this embodiment, a noise shaper circuit in a digital analog converter having a means for rounding 18-bit input data 9 represented by a twos complement into 1-bit output data 10 is characterized by comprising subtractors (SUB) 1 and 3 as means for dividing the input data 9 into upper bits and lower bits with respect to a bit rounded off during a word length converting operation, calculating a difference between the upper bits and feedback data 10a fed back from an output, and linking the difference and the lower bits to output the resultant data.

Figure 2:
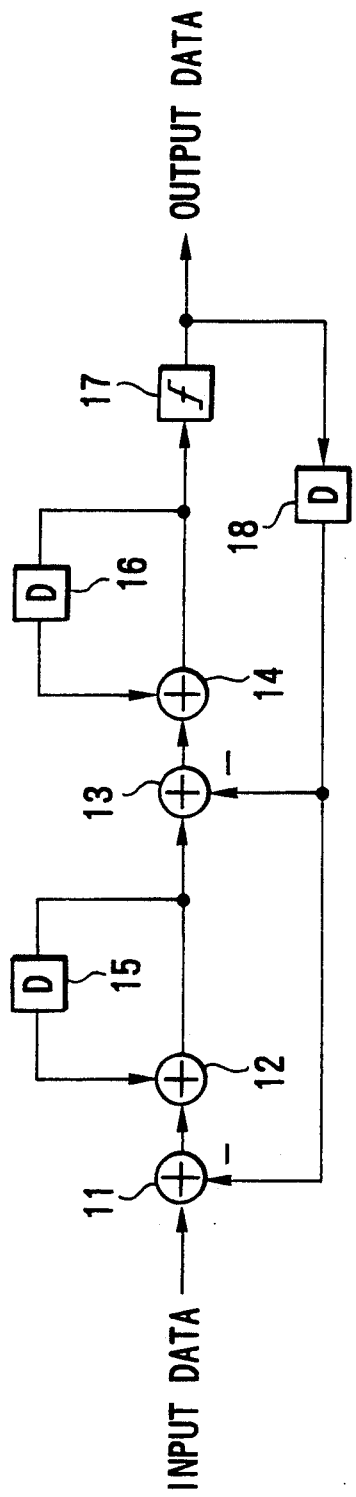
FIG. 2 is a block diagram for explaining a signal flow graph of a secondary $\Delta\Sigma$ modulating circuit.
Figure 3:
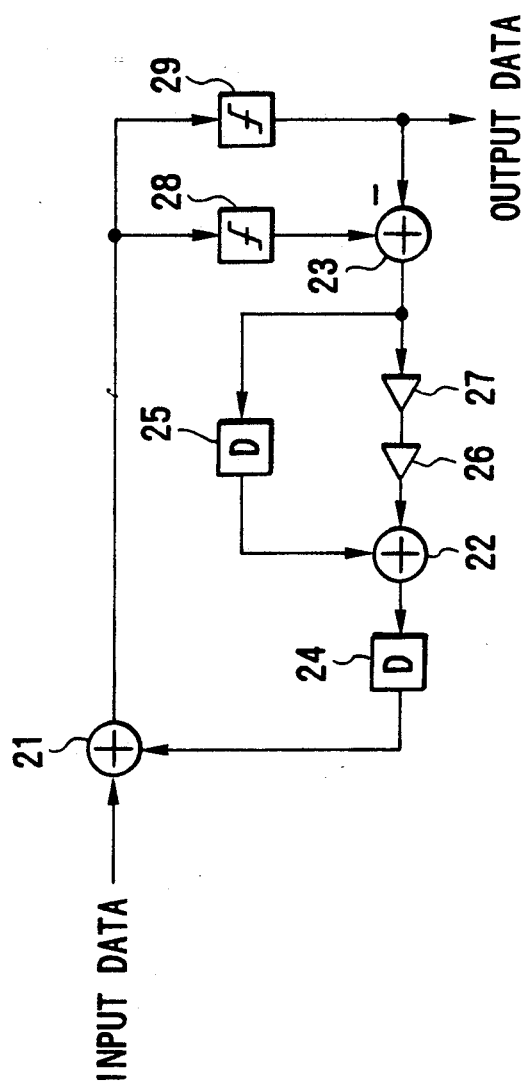
FIG. 3 is a block diagram for explaining another signal flow graph of a secondary $\Delta\Sigma$ modulating circuit.

The subtractor 1 corresponds to the calculating circuit 11 in FIG. 2, divides the 18-bit input data 9 into MSB data and 17-bit data, and calculates a difference between the MSB data and 2-bit feedback data 10a to output 4-bit data. The 17-bit data is added to the LSB of the 4-bit data, and the resultant data is input as 21-bit data to an adder (ADD) 2 serving as a calculating circuit of the next stage (corresponding to the calculating circuit 13 in FIG. 2). The adder 2 adds the fed-back output data and the 21-bit data obtained by adding the 17-bit data to the 4-bit data and outputs 21-bit data. In addition, the subtractor 3 corresponding to the calculating circuit 13 in FIG. 2, divides the 21-bit data obtained as the calculation result of the adder 2 into upper 4-bit data and lower 17-bit data, and calculates a difference between the upper 4-bit data and the 2-bit feedback data 10a to output 4-bit data. The lower 17-bit data which is not used in the calculation is added to the LSB of the 4-bit data to obtain 21-bit data and the resultant 21-bit data is input to adder (ADD) 4 serving as a calculating circuit of the next stage (corresponding to the calculating circuit 14 in FIG. 2). The adder 4 adds the fed-back output data and the 21-bit data obtained by adding the 17-bit data to the 4-bit data to output 21-bit data.

In FIG. 1, reference numerals 5, 6, and 8 denote latch circuits (LAT) corresponding to the delay circuits 15, 16, and 17 in FIG. 2, and reference numeral 7 denotes a comparator (COM) corresponding to the quantizer 17 in FIG. 2. The comparator 7 receives the 21-bit data from the adder 4 to output data 10 rounded into 1-bit data, and the output from the comparator 7 is fed back to the adders 1 and 3.

An operation of this embodiment will now be described mainly with reference to operations of the subtractors 1 and 3. Assume that a signal having a maximum amplitude of ±1 is input as the input data 9.

Assuming that the MSB is set to be a sign bit and the remaining bits are set to have bit positions lower than a decimal point, a range of numerical values which can be represented by 18-bit twos complement data is a range of $-1$ to $+(1-\frac{1}{2}^{-17})$, and the 18-bit data cannot represent $\pm 1$. For this reason, when the number of sign bits is increased by 1 bit to obtain 19-bit data, $+1$ can be represented as "01.0000000000000000", and $-1$ can be represented as "11.0000000000000000". In addition, to round off bits at bit positions lower than a decimal point to obtain 1-bit data is to round data into $\pm 1$. When this phenomenon is used, since digits below the decimal point are "0" in $\pm 1$, no calculation is required. At this time, a value which can be represented by the 18-bit data falls within a range of $-1$ to $+(1-\frac{1}{2}^{-17})$. This range is represented by 19-bit twos complements as a range of "11.0000000000000000" to "00.1111111111111111". As a result, a data range which can be represented by the 18-bit data is decreased by a value corresponding to the LSB. For this reason, a gain of $2^{18}/(2^{18}+1)$, i.e., about $-33 \times 10^{-6}$ dB, is obtained. However, this value is very small, and the value can be neglected when a word length consists of 10 bits or more.

Therefore, the subtractors 1 and 3 (corresponding to the calculating circuits 11 and 13) can be constituted by about 3 bits, and the circuit arrangement shown in FIG. 1 can be obtained since the output dynamic range of a secondary $\Delta\Sigma$ modulating circuit is required to be increased by a factor of 4 to 8 over the input dynamic range. Sign bit extension for securing the output dynamic range requires 3 to 4 bits in place of one bit.

The circuit of this embodiment has an offset corresponding to LSB/2 when 0 is compared. However, in this circuit, the offset of the comparator is differentiated, and it is not obtained as an output, thereby causing no problem.

A chip area of an integrated circuit using this embodiment is estimated to be $\frac{1}{2}$ that of a conventional integrated circuit.

As described above, according to the present invention, there is realized an integrated circuit in which a chip area and a circuit scale are small and data lines having a large word length are not complicated between the input terminal and the output terminal of the integrated circuit. Therefore, the integrated circuit has a large effect.

What is claimed is:

1. A noise shaper circuit comprising:
   first and third calculating means for receiving upper bits of input data having an arbitrary number of bits divided into said upper bits and lower bits with respect to a bit rounded off during a word length converting operation, calculating a difference between the upper bits and feedback data fed back from output data, and for outputting the difference, the difference being linked with the lower bits of the input data to produce linked data;
   second and fourth calculating means for adding the linked data containing the difference from said first and third calculating means to output data fed back from addition outputs from said second and fourth calculating means, respectively; and
   means for rounding the output data from said fourth calculating means into output data having a smaller number of bits,
   wherein the output data from said second calculating means is supplied to said third calculating means, and the output data from said rounding means is supplied to said first and third calculating means as the feedback data,
   said input data having a predetermined word length, wherein said feedback data and respective difference outputs of said first and third calculating means are smaller than said predetermined word length of said input data, the linked data containing the difference from said first and third calculating means having a length greater than that of said input data,
   wherein numbers of bits of the linked data input to the second and fourth calculating means and numbers of bits of the output data from said second and fourth calculating means are identical with those of the linked data containing the difference from the first and third calculating means.

2. A circuit according to claim 1, wherein the input data comprises binary data represented by a twos complement.

3. A circuit according to claim 1, wherein the input data is divided into an MSB and bits lower than the MSB, said first calculating means receiving said MSB.

4. A circuit according to claim 1, wherein said first and third calculating means respectively comprise subtractors, said second and fourth calculating means respectively comprise adders, and said rounding means comprises a comparator.

5. A circuit according to claim 1, wherein said input data comprises 18 bits.

6. A circuit according to claim 1, wherein said feedback data comprises 2 bits.

7. A circuit according to claim 1, wherein each of said linked output data containing the differences of said first and third calculating means, respectively, comprises 21 bits.

8. A circuit according to claim 1, wherein each of said output data of said second and fourth calculating means comprises 21 bits.

9. A circuit according to claim 1, wherein said output data of said rounding means comprises 1 bit.

10. A noise shaper circuit comprising:
    first calculating means for receiving upper bits of input data having an arbitrary number of bits divided into said upper bits and lower bits with respect to a bit rounded off during a word length converting operation, calculating a difference between the upper bits and feedback data fed back from output data, and for outputting the difference, the difference being linked with the lower bits of the input data to produce linked data;
    second calculating means for adding the linked data containing the difference from said first calculating means to output data fed back from an addition output from said second calculating means;
    third calculating means for receiving upper bits of said output data from said second calculating means having an arbitrary number of bits divided into said upper bits and lower bits with respect to said bit rounded off during said word length converting operation, calculating a difference between the upper bits and said feedback data fed back from said output data, and for outputting the difference, the difference being linked with the lower bits of the output data from said second calculating means to produce linked data;

fourth calculating means for adding the linked data containing the difference from said third calculating means to output data fed back from an addition output from said fourth calculating means; and means for rounding the output data from said fourth calculating means into output data having a smaller number of bits, wherein the output data from said second calculating means is supplied to said third calculating means, and the output data from said rounding means is supplied to said first and third calculating means as the feedback data, said input data having a predetermined word length, wherein said feedback data and respective difference outputs of said first and third calculating means are smaller than said predetermined word length of said input data, the linked data containing the difference from said first and third calculating means having a length greater than that of said input data, wherein numbers of bits of the linked data input to the second and fourth calculating means and numbers of bits of the output data from said second and fourth calculating means are identical with those of the linked data containing the difference from the first and third calculating means, said circuit further comprising first and second latching means for respectively latching said output data of said second and fourth calculating means to produce said addition outputs from said second and fourth calculating means, and third latching means for latching the output data of said rounding means, said third latching means providing said feedback data to said first and third calculating means.

11. A circuit according to claim 10, wherein said input data comprises 18 bits.

12. A circuit according to claim 10, wherein said feedback data comprises 2 bits.

13. A circuit according to claim 10, wherein each of said linked output data containing said differences from said first and third calculating means, respectively, comprises 21 bits.

14. A circuit according to claim 10, wherein each of said output data of said second and fourth calculating means comprises 21 bits.

15. A circuit according to claim 10, wherein said output data of said rounding means comprises 1 bit.

* * * * *